(12) United States Patent
Ariyoshi

(10) Patent No.: US 7,271,590 B2
(45) Date of Patent: Sep. 18, 2007

(54) MRI MAGNET APPARATUS FOR VERTICALLY AND CIRCULARLY SUPPRESSING THE MAGNETIC FRINGE FIELD

(75) Inventor: Akihiko Ariyoshi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 69 days.

(21) Appl. No.: 11/121,123

(22) Filed: May 4, 2005

(65) Prior Publication Data

US 2006/0082369 A1    Apr. 20, 2006

(30) Foreign Application Priority Data

Oct. 19, 2004   (JP)   .............................. 2004-304612

(51) Int. Cl.
*G01V 3/00* (2006.01)
(52) U.S. Cl. ........................ 324/320; 324/319
(58) Field of Classification Search ......... 324/318–322
See application file for complete search history.

(56) References Cited

U.S. PATENT DOCUMENTS

| | | | |
|---|---|---|---|
| 5,448,214 A | | 9/1995 | Laskaris |
| 5,565,831 A | | 10/1996 | Dorri et al. |
| 5,874,880 A | * | 2/1999 | Laskaris et al. ............ 335/216 |
| 5,883,558 A | * | 3/1999 | Laskaris et al. ............ 335/216 |
| 5,936,498 A | * | 8/1999 | Takeshima et al. ......... 335/216 |
| 5,982,260 A | * | 11/1999 | Byrne ........................ 335/216 |
| 5,994,991 A | * | 11/1999 | Laskaris et al. ............ 335/299 |
| 6,211,676 B1 | * | 4/2001 | Byrne et al. ................ 324/319 |
| 6,570,475 B1 | * | 5/2003 | Lvovsky et al. ............ 335/216 |
| 6,580,346 B1 | | 6/2003 | Takeshima et al. |
| 6,853,281 B1 | * | 2/2005 | Kakugawa et al. ......... 335/296 |
| 7,053,621 B2 | * | 5/2006 | Kakugawa et al. ......... 324/319 |
| 7,057,391 B1 | * | 6/2006 | Tanabe ....................... 324/318 |
| 7,167,004 B1 | * | 1/2007 | Kruip ......................... 324/320 |
| 2004/0041565 A1 | * | 3/2004 | Kakugawa et al. ......... 324/318 |
| 2005/0253586 A1 | * | 11/2005 | Kakugawa et al. ......... 324/321 |
| 2006/0082369 A1 | * | 4/2006 | Ariyoshi ..................... 324/318 |
| 2006/0125478 A1 | * | 6/2006 | Kakugawa et al. ......... 324/321 |

OTHER PUBLICATIONS

Merrian Webster's Collegiate Dictionary Tenth Edition 1997 by Merriam-Webster incorporated Springfield, Massachusetts, USA p. 900.*

* cited by examiner

*Primary Examiner*—Diego Gutierrez
*Assistant Examiner*—Tiffany A. Fetzner
(74) *Attorney, Agent, or Firm*—Buchanan Ingersoll & Rooney PC

(57) ABSTRACT

In order to suppress fringe field due to the magnetic field generated from shield coils along the center axis of main coils and the shield coils that are disposed with their center axes being identical, when reducing fringe field to the outside of a magnet apparatus using the shield coils, the magnet apparatus is configured so that the radii of the main coils are approximately equal to or smaller than the radii of the shield coils, the radii of auxiliary coils are smaller than the radii of the shield coils, the distance between the two main coils is smaller than the distance between the two shield coils, and the distance between the two shield coils is smaller than the distance between the two auxiliary coils.

6 Claims, 5 Drawing Sheets

1 - Bed
2 - Gradient Coils
4 - RF Coils
100 - Magnet Apparatus

MRI MAGNET APPARATUS FOR VERTICALLY AND CIRCULARLY SUPPRESSING THE MAGNETIC FRINGE FIELD

BACKGROUND OF THE INVENTION

1. Field of the Invention

The present invention belongs to a technological field related to magnetic resonance imaging systems (MRI systems) utilized for imaging diagnosis of living beings, and particularly relates to a magnet apparatus for forming a uniform static-magnetic-field region.

2. Description of the Related Art

Magnetic resonance imaging systems utilizing a magnet apparatus are grossly divided, according to the form of their cryostats—which incorporate magnetic-field generating means such as superconductive coils—into facing-type systems, in which a spherical and uniform static-magnetic-field region is formed between a pair of cryostats, and cylindrical-type systems. Recently, the facing-type systems, which are better from viewpoints such as the subject's feeling of not being confined, and convenience in diagnosing practitioners' accessing the subject, are becoming the mainstream. The magnetic-field strength in the spherical and uniform static-magnetic-field region in the facing-type magnetic resonance imaging system is generally around 6000 through 10000 gauss, with the margin for error usually being several ppm. Meanwhile, in order to achieve uniformity of the static magnetic field, a plurality of magnetic-field generating means are ordinarily used in combination. In addition, in order to reduce fringe field to the outside of the magnet apparatus, the system includes a magnetic-shielding means.

Facing-type magnetic resonance imaging systems as described above include vertical-type systems, in which a pair of magnetic-field generating means are arranged vertically (e.g., see Patent Document 1: Japanese Laid-Open Patent Publication 153408/1997), and horizontal-type systems, in which a pair of magnetic-field generating means are arranged horizontally (e.g., see Patent Document 2: Japanese Laid-Open Patent Publication 187439/1997). For the magnetic-field generating means, superconductive coils are generally used.

In Patent Document 1, as a measure against fringe field to the outside of the magnet apparatus, shield coils having approximately the same diameter as the diameter of main coils are installed with their center axes being identical to those of the main coils, and the shield coils are positioned, along the center axis, farther away from the center of the uniform static magnetic field than the main coils. Current flows through the shield coils in a direction opposite to the main-coil current direction, to reduce fringe field.

Meanwhile, in Patent Document 2, shield coils having a larger diameter than main coils are disposed to reduce fringe field. In addition, it is disclosed that resistive shield coils are installed.

In the magnetic resonance imaging system disclosed in Patent Document 1, so as not to lower the magnetic field strength in the uniform static-magnetic-field region due to the shield coils, the shield coils are kept as far away from the main coils as possible. More specifically, the separation of the shield coils, along the center axis of both, from the center of the uniform static-magnetic-field region is made large. Accordingly, there has been a problem in that the fringe field spreads along the axis around which the coil arrangement is centered, due to the magnetic field generated from the shield coils.

In the magnetic resonance imaging system disclosed in Patent Document 2, shield coils that are larger in radius than the main coils are disposed around the main coils. Meanwhile, when the radius of a circular coil is R and the current is I, the magnetic field H along the center axis of the coil at the point where the distance from the center of the coil is X is expressed according to the following equation:

$$H = 0.5 \times I \times R^2 / (R^2 + X^2)^{1.5}$$

Briefly, there has been a problem in that, due to the shield coils having a large radius, the fringe field spreads along the center axis of the two coils likewise as in Patent Document 1.

SUMMARY OF THE INVENTION

The present invention has been made in consideration of the circumstances described above, and aims to realize a magnet apparatus for suppressing fringe field due to the magnetic field generated from shield coils along the center axis of the main coils and the shield coils that are disposed with their center axes being identical, when reducing fringe field to the outside of the magnet apparatus using the shield coils.

A magnet apparatus according to the invention includes a first static-magnetic-field generating source and a second static-magnetic-field generating source, each having superconductive coils and being disposed facing each other across a uniform static-magnetic-field region. The first static-magnetic-field generating source includes: a first main coil in which current flows in a first circular direction; a first shield coil, disposed with its center axis identical to that of the first main coil, in which current flows in a second circular direction opposite to the first circular direction; a first auxiliary coil, disposed with its center axis identical to that of the first main coil, in which current flows in the first circular direction; and a first cooling container for containing the first main coil, the first shield coil, and the first auxiliary coil. The second static-magnetic-field generating source includes: a second main coil, disposed with its center axis identical to that of the first main coil, in which current flows in the first circular direction; a second shield coil, disposed with its center axis identical to that of the first main coil, in which current flows in the second circular direction; a second auxiliary coil, disposed with its center axis identical to that of the first main coil, in which current flows in the first circular direction; and a second cooling container for containing the second main coil, the second shield coil, and the second auxiliary coil. The radius of the first main coil is approximately equal to or smaller than the radius of the first shield coil, and the radius of the second main coil is approximately equal to or smaller than the radius of the second shield coil. The radius of the first auxiliary coil is smaller than the radius of the first shield coil, and the radius of the second auxiliary coil is smaller than the radius of the second shield coil. The distance between the first main coil and the second main coil is smaller than the distance between the first shield coil and the second shield coil, and the distance between the first shield coil and the second shield coil is smaller than the distance between the first auxiliary coil and the second auxiliary coil.

According to the present invention, a magnet apparatus can be realized, that suppresses fringe field due to the magnetic field generated from shield coils along the center axis of the main coils and the shield coils that are disposed with their center axes being identical, when reducing the fringe field to the outside of the magnet apparatus using the shield coils.

DETAILED DESCRIPTION OF THE PREFERRED EMBODIMENTS

Embodiment 1

Figure 1:
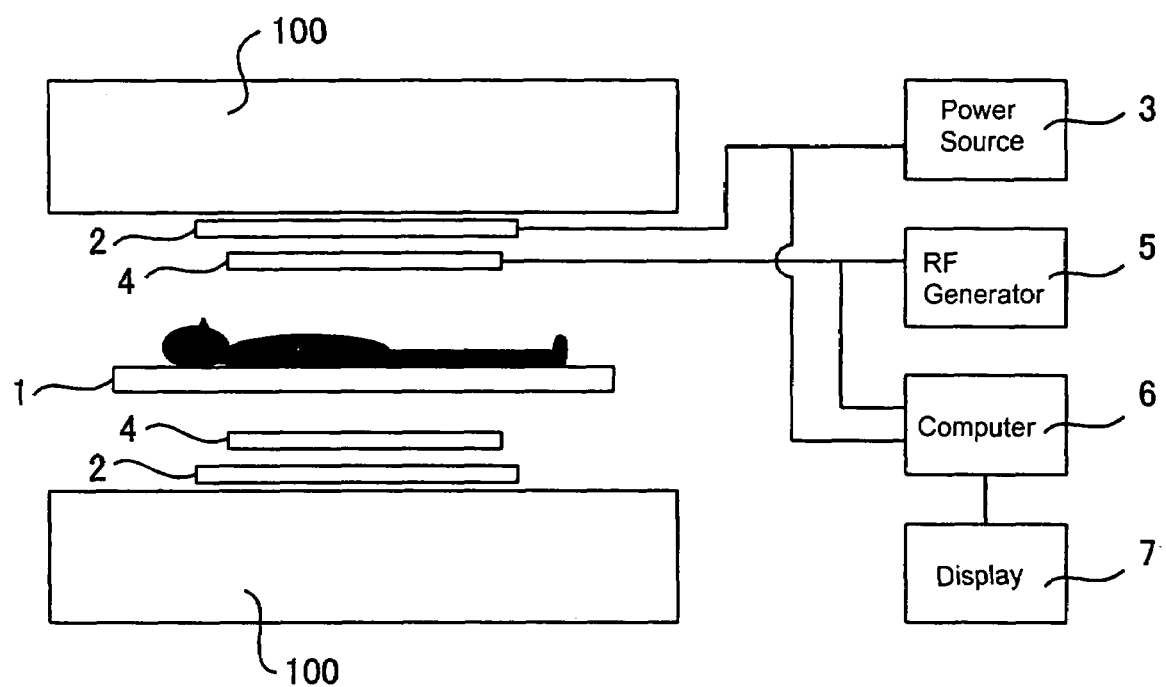
FIG. 1 is a schematic block diagram of a magnetic resonance imaging system, for explaining Embodiment 1.

FIG. 1 is a schematic block diagram for explaining Embodiment 1 of a vertical-type magnetic resonance imaging system to which the present invention is applied. As illustrated in FIG. 1, the magnetic resonance imaging system includes: a bed 1 for a subject to lie upon; a magnet apparatus 100 for generating a static magnetic field to be applied to the subject; magnetic-field-gradient coils 2 and a magnetic-field-gradient power source 3, for forming a magnetic field gradient by imparting a gradient to the magnetic-field strength of the static magnetic field; radio-frequency coils 4 and a radio-frequency magnetic field generator 5, for transmitting a radio-frequency magnetic field to the subject and then receiving nuclear magnetic-resonance signals from the subject; a computer 6 capable of processing the nuclear magnetic-resonance signals into images; and a display device 7 for displaying as tomographic images image signals processed by the computer 6. Although a vertical-type system is explained as an example here, the description can be similarly diverted to a horizontal-type system.

Figure 2:
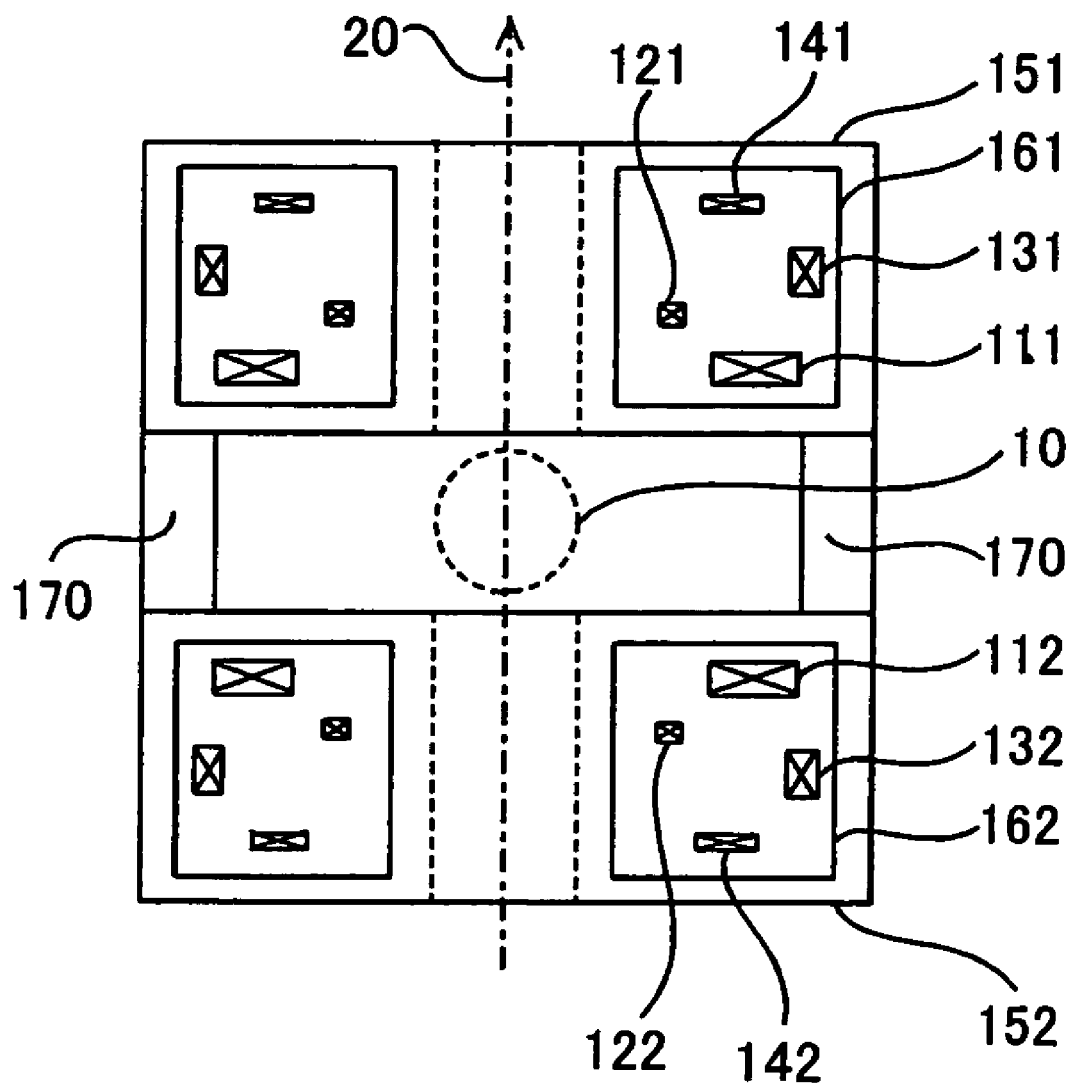
FIG. 2 is a cross-sectional diagram of a magnet apparatus, for explaining Embodiment 1.

FIG. 2 is a cross-sectional diagram of the magnet apparatus 100 used for the magnetic resonance imaging system. The magnet apparatus 100 generates a spherical and uniform static-magnetic-field region 10. An upper static-magnetic-field source and a lower static-magnetic-field source in the magnet apparatus 100 are disposed facing each other across the uniform static-magnetic-field region 10.

The upper static-magnetic-field source has superconductive coils including an upper main coil 111, an upper adjustment coil 121, an upper shield coil 131, and an upper auxiliary coil 141. These superconductive coils are placed with their center axis being a vertical Z-axis 20 passing through the center of the uniform static-magnetic-field region 10. Moreover, these superconductive coils are placed in an upper cylindrical cooling container 161, and cooled to the superconducting temperature by liquid helium as coolant filled in the upper cooling container 161. Furthermore, in order to prevent heat penetration from a room-temperature region, the upper cooling container 161 is placed in an upper cylindrical vacuum container 151.

In the same manner, the lower static-magnetic-field source has superconductive coils including a lower main coil 112, a lower adjustment coil 122, a lower shield coil 132, and a lower auxiliary coil 142. These superconductive coils are placed with their center axis being the vertical Z-axis 20 passing through the center of the uniform static-magnetic-field region 10. Moreover, these superconductive coils are placed in a lower cylindrical cooling container 162, and cooled to the superconducting temperature by liquid helium as coolant filled in the lower cooling container 162. Furthermore, in order to prevent heat penetration from the room-temperature region, the lower cooling container 162 is placed in a lower cylindrical vacuum container 152.

Figure 3:
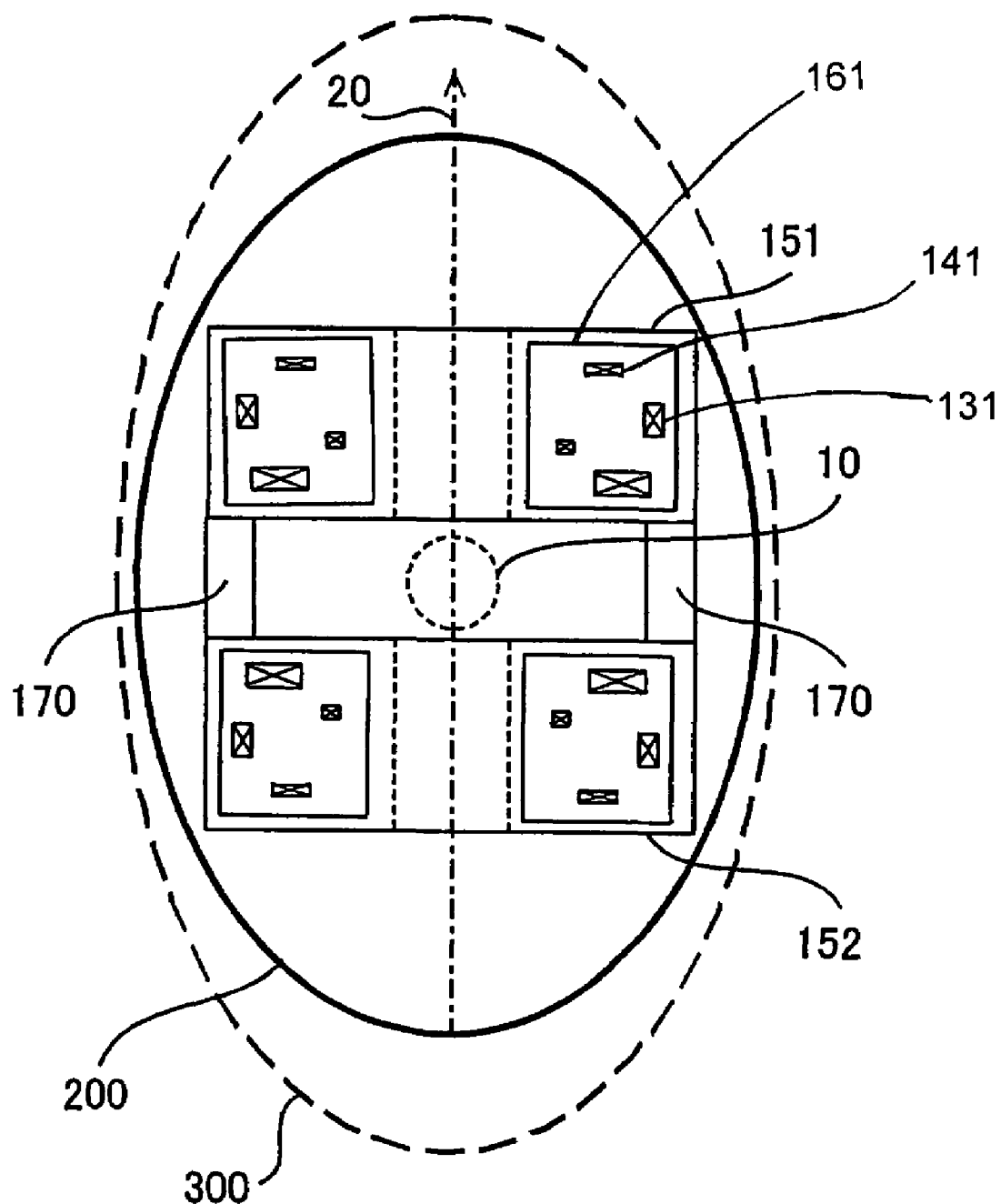
FIG. 3 is an image diagram of fringe field from the magnet apparatus, for explaining Embodiment 1.

The upper vacuum container 151 and the lower vacuum container 152 are connected by means of two connecting members 170 (See FIG. 2 and FIG. 3). Within at least one of the connecting members 170, a cooling pipe for connecting the upper cooling container 161 and the lower cooling container 162 is installed.

Next, currents that flow through the superconductive coils will be described. To the upper main coil 111 and the lower main coil 112, currents flow so that the uniform static-magnetic-field region 10 has a desired magnetic field strength. The direction of the currents is defined as a first circular direction. To the upper shield coil 131 and the lower shield coil 132, currents for suppressing outward fringe field mainly from the circular periphery of the magnet apparatus 100 flow. The direction of the currents is assumed to be a second circular direction opposite to the first circular direction. To the upper auxiliary coil 141 and the lower auxiliary coil 142, currents for suppressing mainly vertically outward fringe field from the magnet apparatus 100 flow. The direction of the currents is the first circular direction. To the upper adjustment coil 121 and the lower adjustment coil 122, currents flow so that the uniform static-magnetic-field region 10 has a desired uniformity of the static magnetic field. The directions of the currents are designated depending on the state of the uniform static-magnetic-field region 10 accordingly.

Next, shapes and locations of the superconductive coils will be described. The radii of the upper main coil 111 and the lower main coil 112 are smaller than the radii of the upper shield coil 131 and the lower shield coil 132. In addition, the distance between the upper main coil 111 and the lower main coil 112 is smaller than the distance between the upper shield coil 131 and the lower shield coil 132. Such a structure has an advantage in suppressing outward fringe field from the circular periphery of the magnet apparatus 100. It is desirable that the radii of the upper main coil 111 and the lower main coil 112 are at least as small as or smaller than the radii of the upper shield coil 131 and the lower shield coil 132.

Meanwhile, the radii of the upper auxiliary coil 141 and the lower auxiliary coil 142 are smaller than the radii of the upper shield coil 131 and the lower shield coil 132. In addition, the distance between the upper shield coil 131 and the lower shield coil 132 is smaller than the distance between the upper auxiliary coil 141 and the lower auxiliary coil 142. Such a structure has an advantage in suppressing vertically outward fringe field from the magnet apparatus 100.

Meanwhile, the radii of the upper adjustment coil 121 and the lower adjustment coil 122 are smaller than the radii of the upper main coil 111 and the lower main coil 112. In addition, the distance between the upper main coil 111 and the lower main coil 112 is smaller than the distance between the upper adjustment coil 121 and the lower adjustment coil 122. Such a structure has an advantage in adjusting uniformity of the static magnetic field within the uniform static-magnetic-field region 10. Moreover, if the magnet apparatus includes a plurality of upper adjustment coils 121 and a plurality of lower adjustment coils 122, it has a further advantage in adjusting the uniformity of the static magnetic field within the uniform static-magnetic-field region 10.

FIG. 3 is an image diagram of the fringe field of the magnet apparatus 100 in the embodiment. In FIG. 3, a fringe field contour line 200 having a predetermined magnetic field strength in the embodiment is illustrated in solid line, and, as a comparative example, a fringe field contour line 300 is illustrated in a dashed line in which the upper auxiliary coil 141 and the lower auxiliary coil 142 (not shown) (arrangement and the like of the other coils are adjusted accordingly) are not used.

When the upper auxiliary coil 141 and the lower auxiliary coil 142 are not present, the more it is apart from the uniform static-magnetic-field region 10 along the Z-axis 20 in particular, the larger becomes the magnetic field strength generated from the upper shield coil 131 and the lower shield coil 132 (not shown in FIG. 3) than the magnetic field strength generated from the upper main coil 111 and the lower main coil 112 (not shown in FIG. 3), and, in consequence, absolute values of the fringe field along the Z-axis 20 sometimes become large. For example, a patient's room on the upper floor above the room where the magnet apparatus 100 is installed is approximately three meters apart from the center of the uniform static-magnetic-field region 10, so that the effect of the fringe field sometimes causes a problem.

Meanwhile, when the upper auxiliary coil 141 and the lower auxiliary coil 142 are provided, static magnetic fields having the polarities opposite to the respective static magnetic fields generated from the upper shield coil 131 and the lower shield coil 132 can be generated. Therefore, by adjusting the magnetic field strength along the Z-axis 20, the fringe field that reaches the patient's room on the upper floor can be reduced.

Here, because the radii of the upper auxiliary coil 141 and the lower auxiliary coil 142 are smaller than the radii of the upper shield coil 131 and the lower shield coil 132, the magnetic field strengths generated from the upper auxiliary coil 141 and the lower auxiliary coil 142 have to be lower than the respective magnetic field strengths generated from the upper shield coil 131 and the lower shield coil 132. Accordingly, effects of another fringe field due to the upper auxiliary coil 141 and the lower auxiliary coil 142 cannot be actually generated.

Thus, the magnet apparatus 100 in which, in the directions along the Z-axis 20, the auxiliary coils 141 and 142 suppress the fringe field due to the magnetic field generated from the shield coils 131 and 132 can be realized. Accordingly, because the fringe field generated from the magnet apparatus 100 can be prevented from affecting the patient's room on the upper floor, the magnetic resonance imaging system can be installed even in a conventional patient's room without shielding measures.

Embodiment 2

Figure 4:
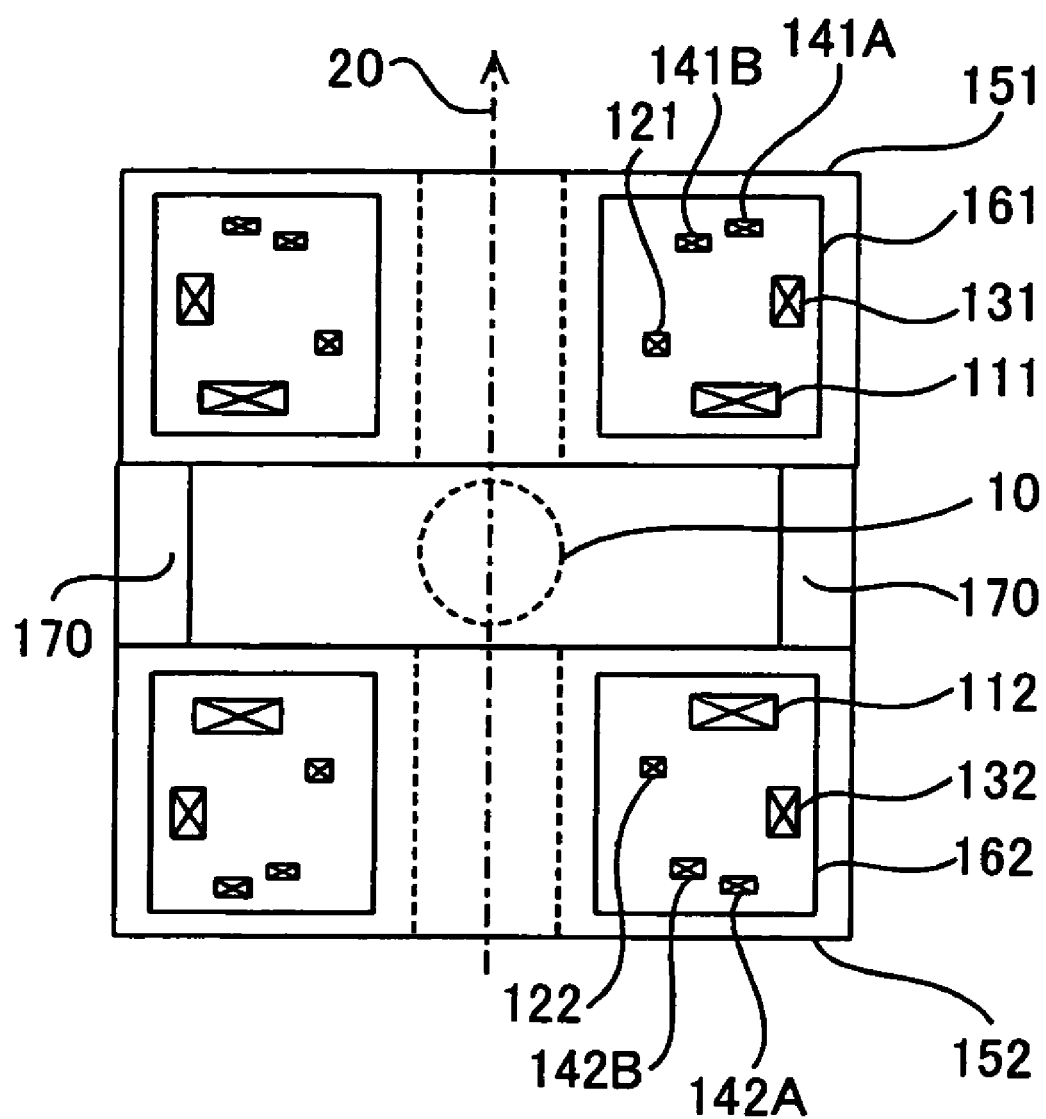
FIG. 4 is a cross-sectional diagram of a magnet apparatus, for explaining Embodiment 2.

FIG. 4 is a cross-sectional diagram of a magnet apparatus 100, for explaining Embodiment 2. The present embodiment is a modified embodiment in which the upper auxiliary coil and the lower auxiliary coil in Embodiment 1 are replaced with a plurality of upper auxiliary coils and a plurality of lower auxiliary coils, respectively. Here, an example in which two upper auxiliary coils and two lower auxiliary coils are included is explained.

In FIG. 4, an upper auxiliary coil 141B is disposed inward of an upper auxiliary coil 141A. In the same manner, a lower auxiliary coil 142B is disposed inward of a lower auxiliary coil 142A. In addition, the distance between the upper auxiliary coil 141B and the lower auxiliary coil 142B is smaller than the distance between the upper auxiliary coil 141A and the lower auxiliary coil 142A. In such an arrangement of auxiliary coils, a set of the upper auxiliary coil 141A and the lower auxiliary coil 142A, and a set of the upper auxiliary coil 141B and the lower auxiliary coil 142B can generate approximately the same magnetic field components toward the center of the uniform static-magnetic-field region 10. This is because the magnetic field components generated toward the center of the uniform static-magnetic-field region 10 are determined by the relationship between the coil-to-coil distance and the inside diameter of the coils. Moreover, the upper auxiliary coil 141A is displaced from the upper auxiliary coil 141B in the direction of the Z-axis 20, which gives an advantage in simultaneously winding wires in production.

Furthermore, magnetomotive forces of the upper auxiliary coils 141A and 141B, and of the lower auxiliary coils 142A and 142B are smaller, respectively, than magnetomotive forces of the upper auxiliary coil 141 and of the lower auxiliary coil 142 in Embodiment 1. Thus, because the two upper auxiliary coils and the two lower auxiliary coils are included, and their magnetomotive forces are made small, the distribution of the outward fringe field from the circular periphery of the magnet apparatus 100, and of the fringe field in the direction of the Z-axis 20 can be minutely adjusted. Accordingly, the fringe field in all directions from the magnet apparatus 100 can be easily reduced. Moreover, it also leads to reduction of electromagnetic forces generated from the upper auxiliary coils 141A and 141B, and from the lower auxiliary coils 142A and 142B, and stability of the superconductive coils increases, whereby an effect of preventing transition to normal conduction (quenching phenomenon) is enhanced.

Embodiment 3

Figure 5:
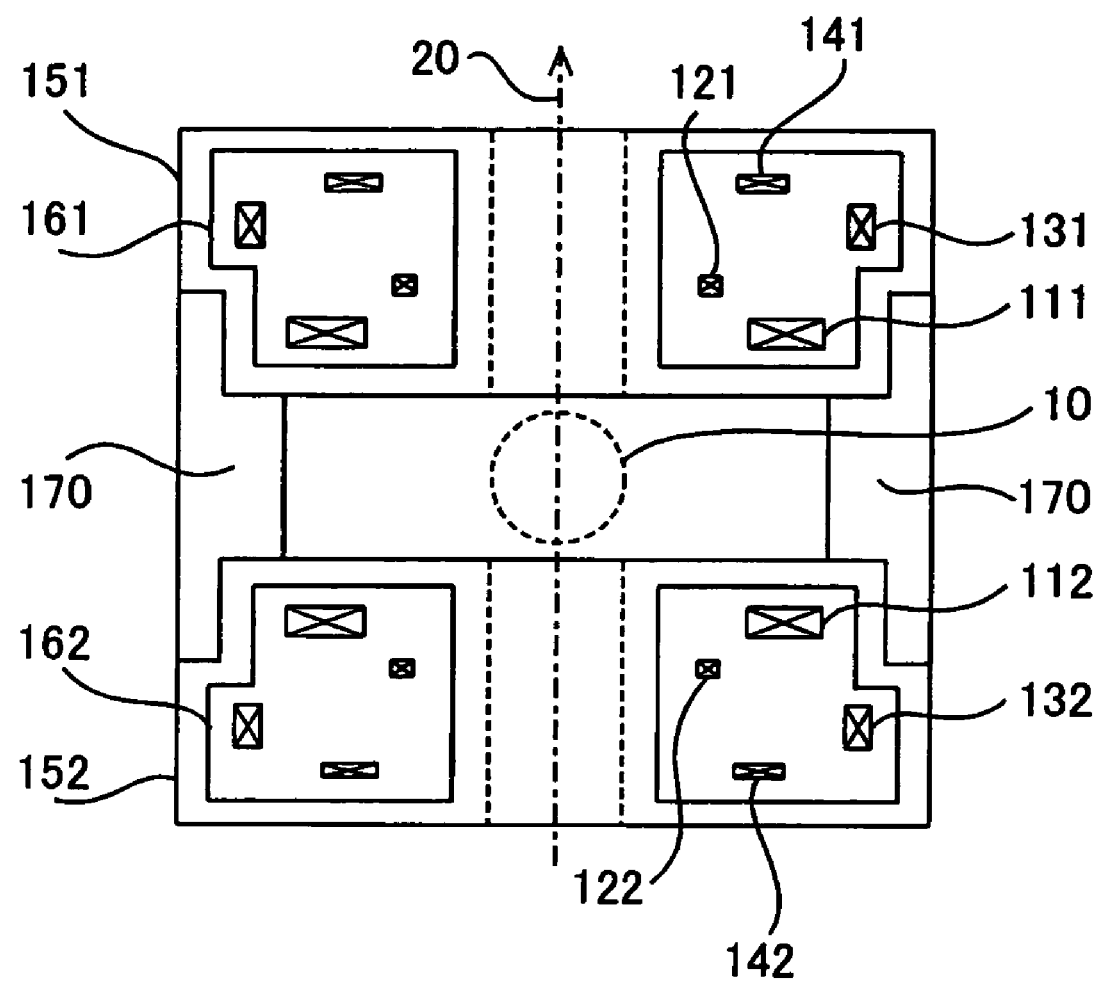
FIG. 5 is a cross-sectional diagram of a magnet apparatus, for explaining Embodiment 3.

FIG. 5 is a cross-sectional diagram of a magnet apparatus 100, for explaining Embodiment 3. The present embodiment is another modified embodiment in which the external diameters of the small cylinders of the cooling containers and of the vacuum containers in Embodiment 1 are smaller than the external diameters farther from the opposing surfaces.

In FIG. 5, the upper vacuum container 151 and the lower vacuum container 152 are each shaped in the form of a cylinder having two sections each of a different external diameter. Hereinafter, sections that are smaller in external diameter and that are closer to the uniform static-magnetic-field region 10 are referred to as small cylinders. Meanwhile, sections that are larger in external diameter and that are farther from the uniform static-magnetic-field region 10 are referred to as large cylinders.

In the same manner, the upper cooling container 161 and the lower cooling container 162 are each shaped in the form of a cylinder, having two sections each of a different external diameter. Hereinafter, sections that are smaller in external diameter and that are closer to the uniform static-magnetic-field region 10 are referred to as small cylinders, and sections that are larger in external diameter and that are farther from the uniform static-magnetic-field region 10 are referred to as large cylinders.

The upper main coil 111 is placed within the small cylinder of the upper cooling container 161, and the upper shield coil 131 and the upper auxiliary coil 141 are placed within the large cylinder of the upper cooling container 161. In the same manner, the lower main coil 112 is placed within the small cylinder of the lower cooling container 162, and the lower shield coil 132 and the lower auxiliary coil 142 are placed within the large cylinder of the lower cooling container 162.

As illustrated in FIG. 5, the radii of the upper main coil 111 and the lower main coil 112 are smaller than the radii of the upper shield coil 131 and the lower shield coil 132. In addition, among the superconductive coils, the upper shield coil 131 and the lower shield coil 132 have the largest radii.

In the embodiment, because the upper vacuum container 151 and the lower vacuum container 152, and the upper cooling container 161 and the lower cooling container 162, are each shaped in the form of a cylinder, having two sections each of a different external diameter, the external diameters of these small cylinders can be reduced to sizes that are sufficient to contain the upper main coil 111 and the lower main coil 112, and to cool the coils to the superconducting temperature. If the external diameters of these large cylinders are the same as those in Embodiment 1, the arrangement of the upper shield coil 131 and the lower shield coil 132, and of the upper auxiliary coil 141 and the lower auxiliary coil 142 is not affected, whereby the outward fringe field from the circular periphery of the magnet apparatus 100 and in the direction of the Z-axis 20 can be suppressed.

Therefore, not only the fringe field from the magnet apparatus 100 in the direction of the Z-axis 20 is suppressed, but the subject's feeling of not being confined is enhanced, and the accessibility from diagnosing practitioners to the subject becomes more convenient.

In addition, in Embodiment 3, each of the upper auxiliary coil and the lower auxiliary coil can be replaced with a plurality of coils as in Embodiment 2.

What is claimed is:

1. A magnet apparatus comprising:
   a first static-magnetic-field generating source and a second static-magnetic-field generating source, each including superconductive coils and being disposed facing each other across a uniform static-magnetic-field region;
   the first static-magnetic-field generating source including:
      a first main coil in which current flows in a first circular direction;
      a first shield coil, disposed with its center axis identical to that of the first main coil, in which current flows in a second circular direction opposite to the first circular direction;
      a first auxiliary coil, disposed with its center axis identical to that of the first main coil, in which current flows in the first circular direction; and
      a first cooling container for containing the first main coil, the first shield coil, and the first auxiliary coil;
   the second static-magnetic-field generating source including:
      a second main coil, disposed with its center axis identical to that of the first main coil, in which current flows in the first circular direction;
      a second shield coil, disposed with its center axis identical to that of the first main coil, in which current flows in the second circular direction;
      a second auxiliary coil, disposed with its center axis identical to that of the first main coil, in which current flows in the first circular direction; and
      a second cooling container for containing the second main coil, the second shield coil, and the second auxiliary coil;
   wherein the radius of the first main coil is substantially equal to or smaller than the radius of the first shield coil;
   the radius of the second main coil is substantially equal to or smaller than the radius of the second shield coil;
   the radius of the first auxiliary coil is smaller than the radius of the first shield coil;
   the radius of the second auxiliary coil is smaller than the radius of the second shield coil;
   the distance between the first main coil and the second main coil is smaller than the distance between the first shield coil and the second shield coil;
   the distance between the first shield coil and the second shield coil is smaller than the distance between the first auxiliary coil and the second auxiliary coil;
   the upper and lower shield coils suppress an outward fringe field from a circular periphery of the magnetic apparatus; and
   the upper and lower auxiliary coils vertically suppress the outward fringe field from the magnetic apperatus.

2. A magnet apparatus according to claim 1, further comprising a plurality of said first auxiliary coils and a plurality of said second auxiliary coils.

3. A magnet apparatus according to claim 1, wherein
   the first cooling container and the second cooling container are each shaped in the form of a cylinder having two sections each of a different external diameter;
   in each cylinder, the external diameter of the section that is closer to the uniform static-magnetic-field region is smaller than the external diameter of the section that is farther from the uniform static-magnetic-field region;
   the first main coil is disposed inward of the first-cooling-container cylinder section that is closer to the uniform static-magnetic-field region; and
   the second main coil is disposed inward of the second-cooling-container cylinder section that is closer to the uniform static-magnetic-field region.

4. A magnetic resonance imaging system comprising:
   a bed configured for a subject to lie upon;
   a magnet apparatus generating a static magnetic field to be applied to the subject;
   a magnetic-field-gradient coil and a magnetic-field-gradient power source, forming a magnetic field gradient by imparting a gradient to the magnetic-field strength of the static magnetic field;
   a radio-frequency coil and a radio-frequency magnetic field generator, transmitting a radio-frequency magnetic field to the subject and then receiving nuclear magnetic resonance signals from the subject;
   a computer capable of processing the nuclear magnetic resonance signals into images; and
   a display device for displaying as tomographic images, image signals processed by the computer;
   the magnet apparatus comprising:
      a first static-magnetic-field generating source and a second static-magnetic-field generating source, each including superconductive coils and being disposed facing each other across a uniform static-magnetic-field region;
      the first static-magnetic-field generating source including:
         a first main coil in which current flows in a first circular direction; a
         first shield coil, disposed with its center axis identical to that of the first main coil, in which current flows in a second circular direction opposite to the first circular direction;
         a first auxiliary coil, disposed with its center axis identical to that of the first main coil, in which current flows in the first circular direction; and a first cooling container containing the first main coil, the first shield coil, and the first auxiliary coil;

the second static-magnetic-field generating source including:

a second main coil, disposed with its center axis identical to that of the first main coil, in which current flows in the first circular direction;

a second shield coil, disposed with its center axis identical to that of the first main coil, in which current flows in the second circular direction;

a second auxiliary coil, disposed with its center axis identical to that of the first main coil, in which current flows in the first circular direction; and a second cooling container for containing the second main coil, the second shield coil, and the second auxiliary coil;

wherein the radius of the first main coil is substantially equal to or smaller than the radius of the first shield coil;

the radius of the second main coil is substantially equal to or smaller than the radius of the second shield coil;

the radius of the first auxiliary coil is smaller than the radius of the first shield coil;

the radius of the second auxiliary coil is smaller than the radius of the second shield coil;

the distance between the first main coil and the second main coil is smaller than the distance between the first shield coil and the second shield coil;

the distance between the first shield coil and the second shield coil is smaller than the distance between the first auxiliary coil and the second auxiliary coil;

the upper and lower shield coils suppress an outward fringe field from a circular periphery of the magnetic apperatus; and the upper and lower auxiliary coils vertically suppress the outward fringe field from the magnetic appertus.

5. A magnetic resonance imaging system according to claim 4, wherein the magnet apparatus further comprises a plurality of said first auxiliary coils and a plurality of said second auxiliary coils.

6. A magnetic resonance imaging system according to claim 4, wherein the first cooling container and the second cooling container are each shaped in the form of a cylinder having two sections each of a different external diameter;

in each cylinder, the external diameter of the section that is closer to the uniform static-magnetic-field region is smaller than the external diameter of the section that is farther from the uniform static-magnetic-field region;

the first main coil is disposed inward of the first-cooling-container cylinder section that is closer to the uniform static-magnetic-field region; and the second main coil is disposed inward of the second-cooling-container cylinder section that is closer to the uniform static-magnetic-field region.

* * * * *